US008472262B2

(12) United States Patent
Perner

(10) Patent No.: US 8,472,262 B2
(45) Date of Patent: Jun. 25, 2013

(54) SENSE AMPLIFIER FOR READING A CROSSBAR MEMORY ARRAY

(75) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 309 days.

(21) Appl. No.: 12/813,003

(22) Filed: Jun. 10, 2010

(65) Prior Publication Data

US 2011/0305063 A1 Dec. 15, 2011

(51) Int. Cl.
*G11C 7/10* (2006.01)

(52) U.S. Cl.
USPC ..................... 365/189.05; 365/148

(58) Field of Classification Search
USPC ............. 365/148, 158, 163, 171, 173, 189.05
See application file for complete search history.

(56) References Cited

U.S. PATENT DOCUMENTS

| 6,819,612 | B1 * | 11/2004 | Achter ........................ 365/205 |
| 7,130,235 | B2 * | 10/2006 | Perner ........................ 365/207 |
| 7,372,753 | B1 * | 5/2008 | Rinerson et al. .............. 365/209 |
| 7,450,428 | B2 | 11/2008 | Martines et al. |
| 7,453,715 | B2 | 11/2008 | Parkinson |
| 7,453,751 | B2 | 11/2008 | Forbes et al. |
| 2008/0205158 | A1 | 8/2008 | Pagano et al. |
| 2009/0059672 | A1 | 3/2009 | Kern |

FOREIGN PATENT DOCUMENTS

WO 2009036278 A1 3/2009

* cited by examiner

*Primary Examiner* — Alexander Sofocleous
*Assistant Examiner* — Lance Reidlinger

(57) ABSTRACT

A sense amplifier for reading the data stored in a crossbar array includes a storage transistor to store a first voltage resulting from an electric current from a column line connected to a target memory element while the target memory element is half-selected, the first voltage resulting from bias voltages applied to row lines not connected to the target memory element; a mirror transistor to store a second voltage resulting from an electric current from the column line while the target memory element is fully selected; a cross-coupled inverter circuit having a first branch connected to the storage transistor and a second branch connected to the mirror transistor; and an output node to output a signal from the first branch of the cross-coupled inverter circuit, the signal based on a comparison between the first voltage stored in the storage transistor and the second voltage across the mirror transistor.

20 Claims, 7 Drawing Sheets

SENSE AMPLIFIER FOR READING A CROSSBAR MEMORY ARRAY

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

As the use of digital data increases, the demand for faster, smaller, and more efficient memory structures increases. One type of memory structure that has recently been developed is a crossbar memory array. A crossbar memory array includes a set of upper parallel wires which intersect a set of lower parallel wires. A programmable memory element configured to store digital data is placed at each intersection of the wires.

One type of programmable memory element which may be used is a memristive element. A memristive element is a device which changes the state of its resistance based on an applied programming condition. For example, a programming condition may be applied to change the memristive element from a high resistive state to a low resistive state or vice versa. A high resistive state may represent a digital "1" and a low resistive state may represent a digital "0".

One challenge that results from the use of a crossbar memory structure is the process of reading the state of a target memory element within the crossbar array. The state of a memory element may be determined by applying a sense voltage to the target memory element. Then, the electric current flowing through the target memory element will be indicative of the resistive state of the target memory element.

However, when applying a sense voltage to a target memory element, the electric current flowing from the target memory element will be adversely affected by the half-selected memory elements within the crossbar array. Thus, it is difficult to isolate the electric current flowing through the target memory element that is resulting from only the applied sense voltage across the target memory element.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
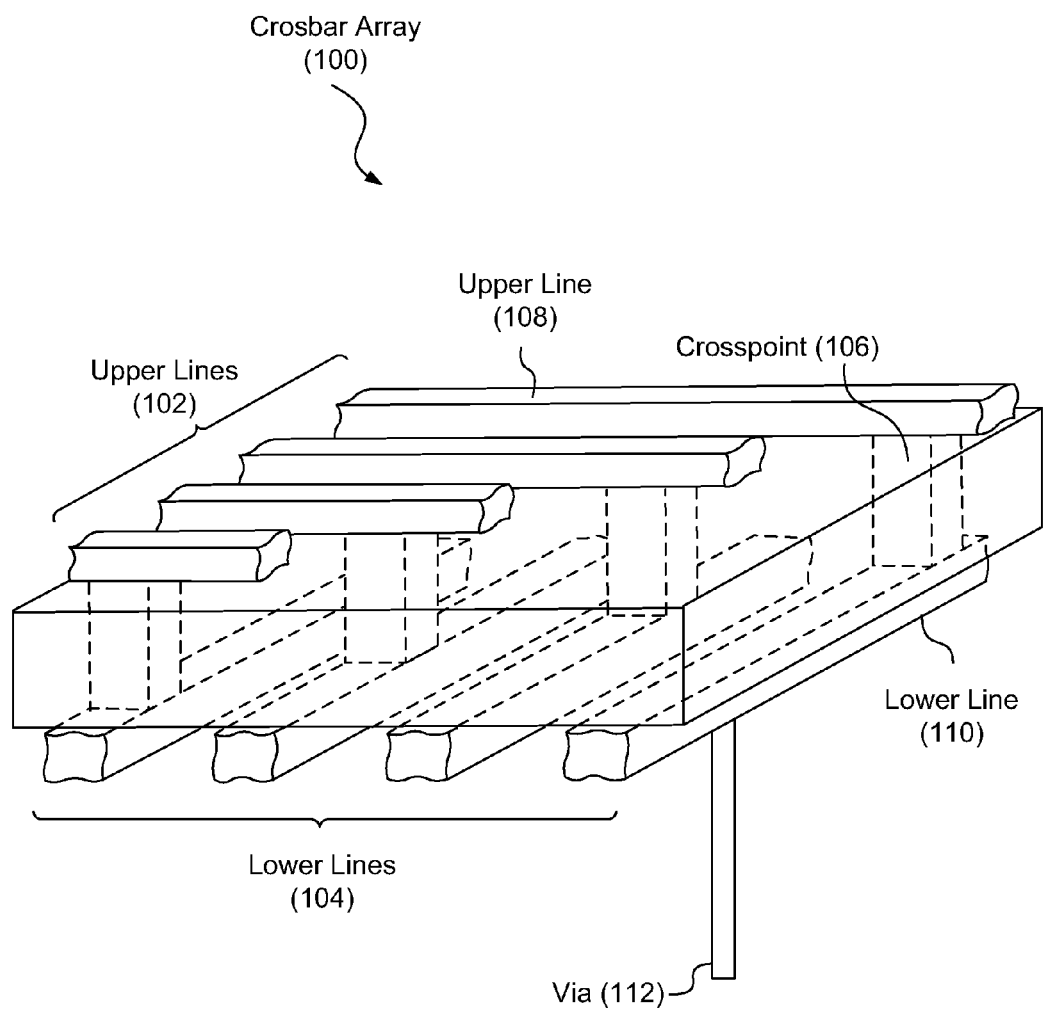
FIG. 1 is a diagram showing an illustrative crossbar array, according to one example of principles described herein.

As mentioned above, one challenge that results from the use of a crossbar memory structure is the process of reading the state of a target memory element. The state of a memory element may be determined by applying a sense voltage on one side of a target memory element. The electric current flowing through the target memory element will then be indicative of the resistive state of the target memory element.

However, when applying a sensing voltage to a target memory element, the electric current flowing from the target memory element will be adversely affected by the half-selected memory elements within the crossbar array. Thus, it is difficult to isolate the electric current flowing through the target memory element that is resulting from only the applied sense voltage across the target memory element. This renders less accurate the corresponding determination of resistance value of the target memory element.

One solution has been to use isolation elements such as diodes or transistors which may selectively inhibit the flow of electric current from unselected memory elements. However, this approach requires the use of several additional electronic components. The additional components prohibit the memory structure from being designed with a higher memory density.

In light of these and other issues, the present specification discloses a method for using a sense amplifier to accurately sense the state of a selected memory device, such as the resistance value of a memristive memory device, without the need for such isolation elements.

For purposes of illustration the two sets of intersecting parallel lines of a crossbar array will be referred to as row lines and column lines. Either the row or column lines may be the upper or lower lines.

According to certain illustrative examples, to select a target memory element, a sense amplifier is switched to a column line connected to the target memory element. When the sense amplifier is switched to the column line, all memory elements along that column line, including the target memory element, become half-selected. The half-selected memory elements cause an electric current to flow through the selected column line and into the sense amplifier. This electric current is a result of bias voltages applied to the row lines connected to the half-selected memory elements. This electric current is not indicative of the state of the target memory element. Consequently, this electric current may be referred to as a noise current. The noise current will cause a voltage to be applied at the gate of a sensing transistor within the sense amplifier. This voltage may then be mirrored to a storage transistor.

After the gate voltage of the sensing transistor has been stored in the storage transistor, a sense voltage is applied to the row line connected to the target memory element. The sense voltage will then be applied across the target memory element, causing an electric current to flow through the target memory element and to the sense amplifier connected to the column line. This second electric current will include both the noise current and the electric current flowing through the target memory element. This second voltage will cause a second voltage across the gate of the sensing transistor of the sense amplifier. This voltage is then mirrored to a mirror transistor within the sense amplifier.

The sense amplifier includes two cross coupled inverters. The cross coupled inverters form a circuit which essentially has two outputs. During normal operation of the cross coupled inverters, while the output of the first inverter produces a "high" signal, the output of the second inverter produces a "low" signal. Conversely, while the output of the first inverter produces a "low" signal, the output of the second inverter produces a "high" signal. The state of the two inverters is dependent upon the signal being received into each of the inverters. According to certain illustrative examples, the first inverter may receive a signal from the storage transistor and the second inverter may receive a signal from the mirror transistor. The difference between the signals stored in the mirror transistor and the storage transistors is dependent upon the state of the target memory element. Thus, the state of the target memory element will set the state of both inverters. The output of the first inverter will then produce either a high signal or a low signal at the appropriate voltage levels to indicate a digital '1' or a digital '0'.

Through use of a system or method embodying principles described herein, the state of a target memory element within a crossbar array may be determined using a sense amplifier and without the need for isolation elements. Without isolation elements, a memory structure with a higher density and lower cost may be realized. The higher memory density allows more data to be stored within a smaller physical amount of space. Additionally, the sense amplifier produces a digital output at the appropriate voltage levels for an electronic device utilizing the crossbar array.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the terms "memory array" and "memory structure" are to be broadly interpreted as the physical structure of an electronic circuit designed to store digital data. A memory array or structure may include a number of programmable devices configured to be set to a number of different states.

Throughout this specification and in the appended claims, the term "crossbar array" or "crossbar memory array" is to be broadly interpreted as a device having a number of lower wire lines intersecting a number of upper wire lines, where a programmable logic device is disposed at each crosspoint between an upper wire segment and a lower wire segment.

Throughout this specification and in the appended claims, the term "memory element" is to be broadly interpreted as a component configured to be programmed with a value or state and maintain that value or state to be read at a later time. An example of a memory element is a memristive element.

Throughout this specification and in the appended claims, the terms "row lines" and "column lines" are used to differentiate between a first set of parallel lines intersecting a second set of parallel lines. Either the row or column lines may be the upper set of lines in any particular application.

Referring now to the figures, FIG. 1 is a diagram showing an illustrative crossbar memory array architecture (100). According to certain illustrative examples, the crossbar memory array (100) may include an upper set of lines (102) which may generally be in parallel. Additionally, a lower set of lines (104) is generally perpendicular to, and intersects, the upper lines (102). Programmable crosspoint or memory devices (106) are formed at the intersections between an upper line (108) and a lower line (110).

According to certain illustrative examples, the programmable crosspoint devices (106) may be memristive devices. Memristive devices exhibit a "memory" of past electrical conditions. For example, a memristive device may include a matrix material that contains mobile dopants. These dopants can be moved within a matrix to dynamically alter the electrical operation of an electrical device, such as the resistance of that device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field.

As indicated, by changing the dopant configurations within a memristive matrix, the electrical resistance of the device may be altered. The memristive device is then read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar memory array (100) may be used to form a non-volatile memory array. Non-volatile memory has the characteristic of not losing its contents when no power is being supplied. Each of the programmable crosspoint devices (106) is used to represent one or more bits of data. Although individual crossbar lines (108, 110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar memory array (100) may be integrated into a Complimentary Metal-Oxide-Semiconductor (CMOS) circuit or other conventional computer circuitry. Each individual wire segment may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2:
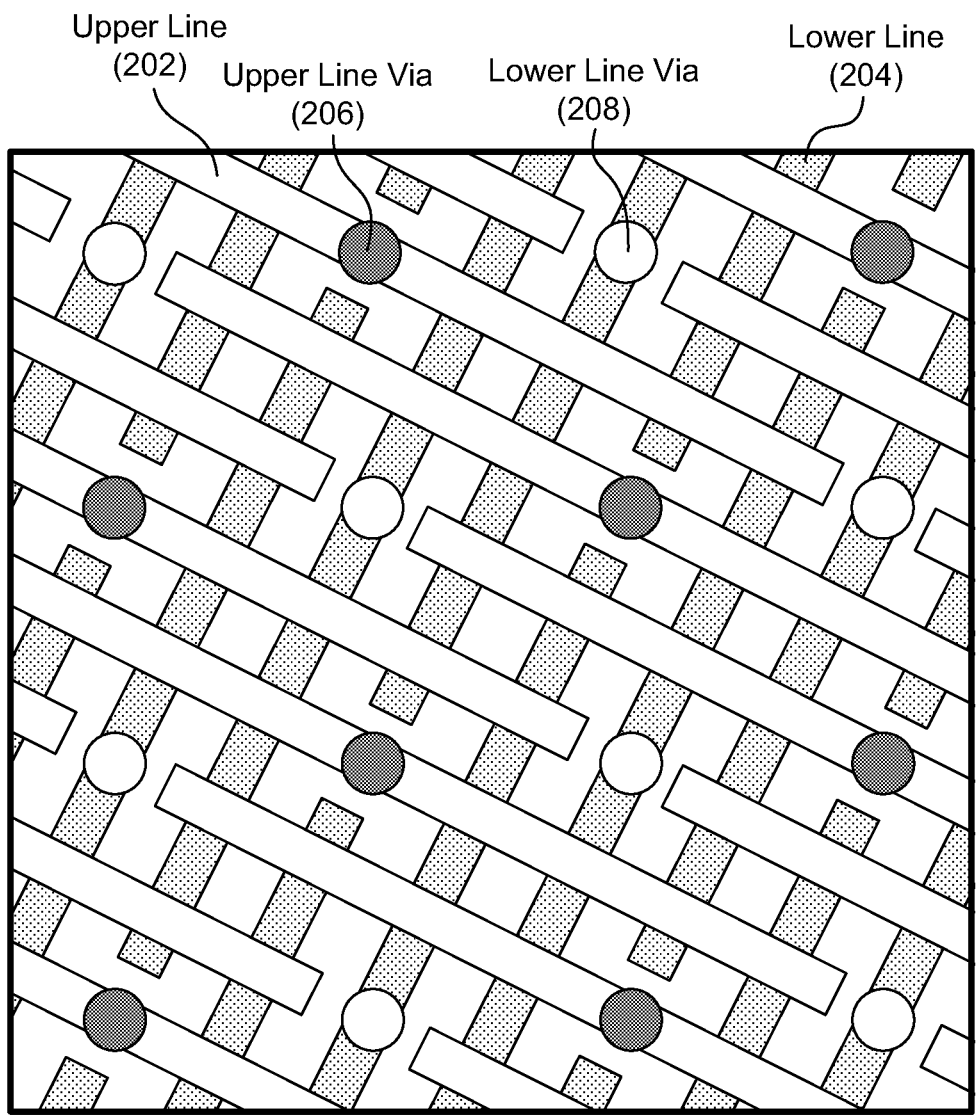
FIG. 2 is a diagram showing an illustrative disjointed crossbar array, according to one example of principles described herein.

FIG. 2 is a diagram showing an illustrative disjointed crossbar array (200). According to certain illustrative examples, a crossbar array may be structured in a disjointed manner. That is, the end crosspoints of two adjacent parallel upper lines (202) intersect different lower lines (204). In one type of disjointed crossbar array (200), the lower line vias (208) and the upper line vias (206) may each be positioned in the middle of their respective lines. Thus, the line vias (206, 208) will have an equal number of memory elements on each side. Such a crossbar structure is merely one type of crossbar structure in which the principles described herein may be used.

As mentioned above, when selecting a target memory element to be read, it is difficult to isolate the voltage or current which has been affected by the target memory element alone. Consequently, the present specification discloses methods and systems for reading the state of a target memory element without the need for isolation elements.

Figure 3:
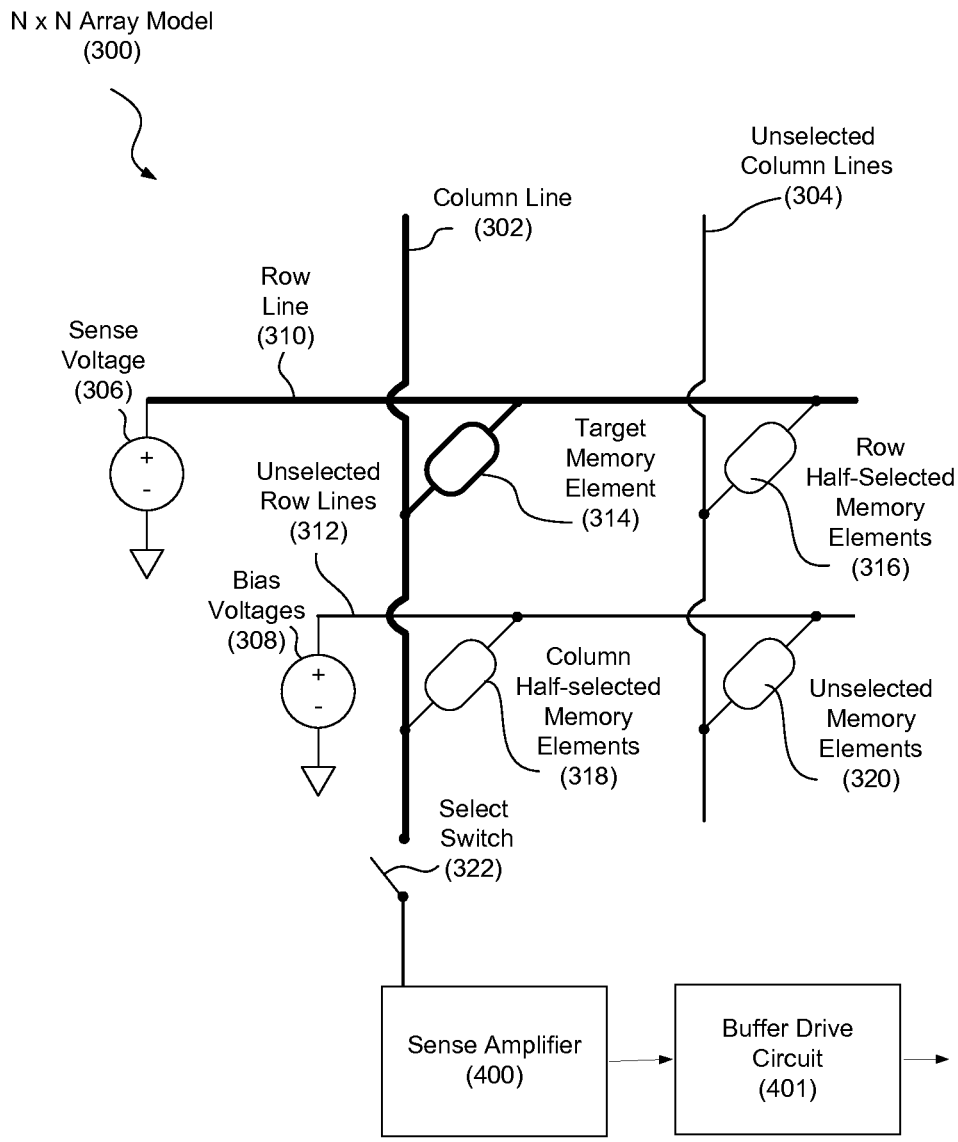
FIG. 3 is a diagram showing an illustrative model of an N×N crossbar array, according to one example of principles described herein.

FIG. 3 is a diagram showing an illustrative N×N crossbar array. While a practical crossbar array may include a 512×512 array, a much smaller 2×2 array is shown for purposes of this explanation to more simply illustrate and model the principles of reading the state of memory elements that can be identically applied within larger arrays.

According to certain illustrative examples, a target memory element (314) becomes half-selected by switching a column line (302) connected to the target memory element (314) to a sense amplifier (400). The components and operation of the sense amplifier (400) will be discussed in more detail below in the text accompanying FIG. 4.

With the sense amplifier (400) switched to the column line (302), each memory element (318) along the column line (302), including the target memory element, becomes half-selected. Bias voltages (308) applied to the row lines (312) connected to the half-selected memory elements (318) will cause an electric current to flow through the half-selected memory elements (318) and to the sense amplifier (400). This electric current is not indicative of the resistive state of the target memory element (314). Consequently, this electric current may be referred to as noise current. At this point, the sense amplifier (400) may store the value of the noise current for later use.

In order to fully select the target memory element (314), a sense voltage (306) is applied to the row line (310) connected to the target memory element (314). Applying the sense voltage (306) to the row line (310) causes each memory element (316) along the row line (310) to become half-selected, except for the target memory element (314) which becomes fully selected. The remaining elements within the crossbar array may be referred to as simply unselected memory elements (320). With the target memory element (314) fully selected, the sense voltage (306) is applied across the target memory element (314). This causes an electric current to flow through the target memory element (314) and to the sense amplifier (400).

At this point the electric current flowing into the sense amplifier (400) includes both the noise current and the current from the target memory element (314) resulting from the applied sense voltage (306). The sense amplifier (400) can then compare the noise current stored earlier with the current now flowing from the column line. This comparison can be used to produce an output logic level indicative of the resistive state of the target memory element (314).

Figure 4:
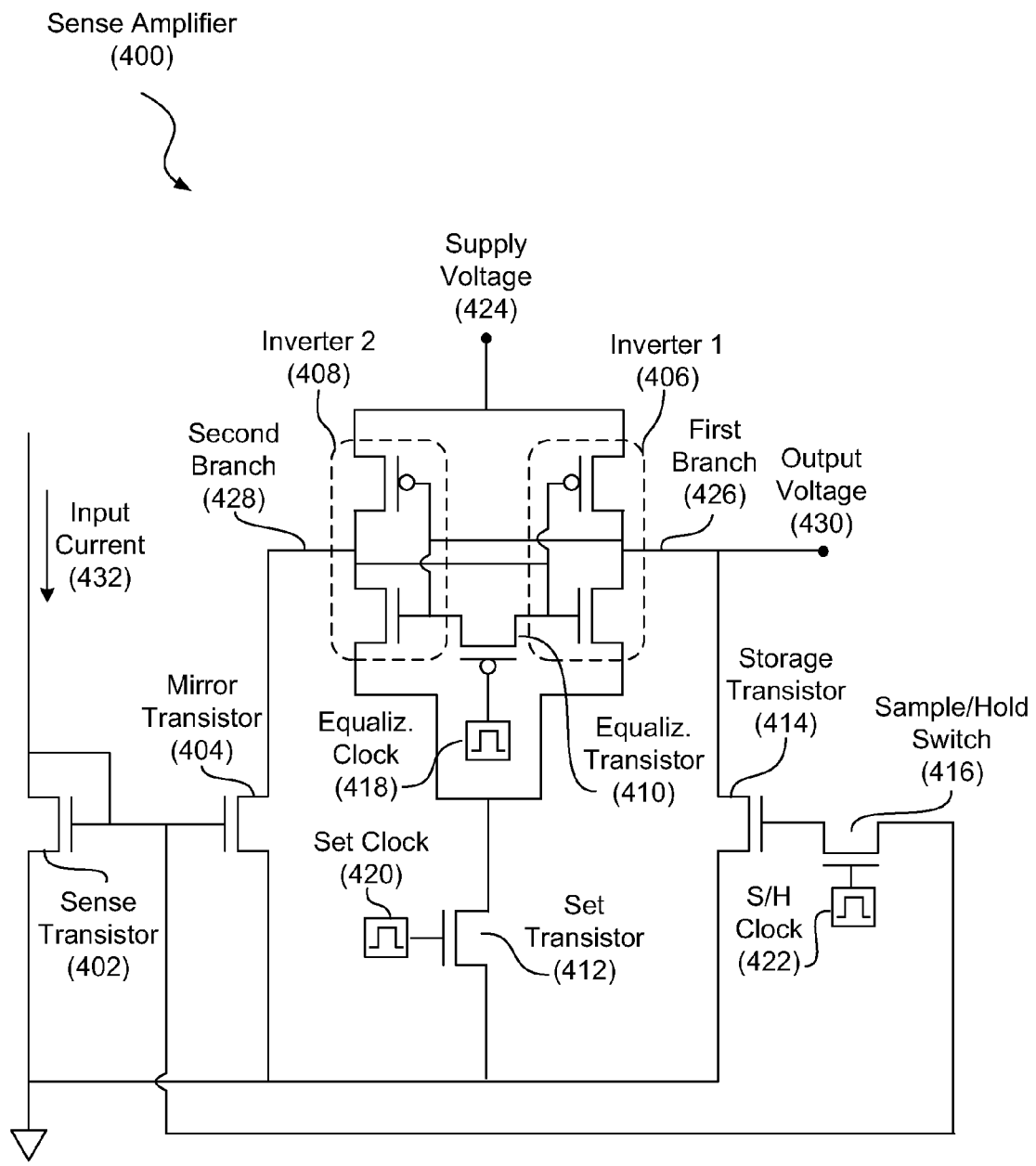
FIG. 4 is a diagram showing an illustrative circuit schematic of a sense amplifier, according to one example of principles described herein.

FIG. 4 is a diagram showing an illustrative circuit schematic of a sense amplifier (400). The following describes the operation of the sense amplifier during the process of reading data from a crossbar memory array. Particularly, the following describes the manner in which the sense amplifier stores the noise current from the column line while the target memory is half-selected and compares that noise current with the electric current flowing from the column line while the target memory element is fully selected.

The input current (432) forms a voltage across the sense transistor (402). This voltage is then coupled to the gate terminal of the mirror transistor (402) and the input current (432) is mirrored across the mirror transistor (404). Additionally, if the sample and hold switch (416) is closed, then this voltage will also be coupled to the gate terminal of the storage transistor (414) and the input current (432) will be mirrored across the storage transistor (414).

While the target memory element (e.g. 314, FIG. 3) is only half-selected, the sample and hold clock (422) causes the sample and hold switch (416) to be closed. As the input current (432) at this point is the noise current from the half-selected memory elements (e.g. 318, FIG. 3) along the selected column line (e.g. 302, FIG. 3), the voltage mirrored to the storage transistor (414) is a result of the noise current.

The sample and hold clock (422) then opens the sample and hold switch (416). With the sample and hold switch (416) open, the storage transistor (414) no longer mirrors the sense transistor (402). Rather, the storage transistor holds the voltage being mirrored from the sense transistor (402) at the moment the sample and hold switch (416) was opened.

With the noise current stored in the storage transistor (414), the target memory element can then become fully selected. After the target memory element is fully selected, the input current (432) of the sense amplifier is a result of both the noise current and the current flowing through the target memory element. This new input current (432) value creates a new voltage across the sense transistor (402). This new input current is then mirrored across the mirror transistor (404). Because the sample and hold switch is open, the storage transistor (414) maintains its previous voltage level without being affected by the new voltage level experienced by the sense transistor (402).

The storage transistor (414) is connected to a first branch (426) of a cross coupled inverter circuit. Additionally, the mirror transistor (404) is connected to a second branch (428) of the cross coupled inverter circuit. The voltage stored in the storage transistor (414) causes a current equivalent to the noise current to flow through the first branch (426). Additionally, the voltage across the mirror transistor (404) causes a current equivalent to the noise current plus the current flowing through the target memory element to flow through the second branch (428).

A cross coupled inverter circuit comprises two inverters. Each inverter includes an N-channel transistor and a P-channel transistor in series. An input to an inverter is connected to both the gate terminal of the P-channel transistor and the gate terminal of the N-channel transistor. If the voltage signal on the input of an inverter is high, than the output of the inverter will be a low voltage signal. Conversely, if the input to an inverter is a low voltage signal, than the output of the inverter will be a high voltage signal roughly equivalent to the supply voltage (424). In a cross-coupled inverter circuit, the output of each inverter is connected to the input of the other inverter. This produces a circuit in which during normal operation, only one inverter will output a high voltage signal at a given time. The other inverter will output a low voltage signal.

FIG. 4 illustrates inverter 1 with its output connected to the input of inverter 2 (408). Likewise, the output of inverter 2 (408) is connected to the input of inverter 1 (406). The output of inverter 1 (406) is connected to the storage transistor (414) through the first branch (426) and the output of inverter 2 (408) is connected to the mirror transistor (404) through the second branch (428). Consequently, the input to inverter 1 (406) will receive a signal from the mirror transistor (404) and the input to inverter 2 (408) will receive a signal from the storage transistor (414).

If the target memory element is in a low resistive state, then the current flowing through the target memory element will be relatively large. Thus, the voltage across the mirror transistor (404) will be substantially larger than the voltage stored in the storage transistor (414). This will cause the output of inverter 1 (406) to produce a high voltage signal while the output of inverter 2 (408) produces a low voltage signal.

If the target memory element is in a high resistive state, than the current flowing through the target memory element will be relatively small. Thus, the voltage across the mirror transistor (404) will not be too much larger than the voltage stored in the storage transistor (414). This will cause the output of inverter 1 (406) to produce a low signal while the output of inverter 2 (408) produces a high signal.

The output voltage node (430) of the sense amplifier is connected to the output of inverter 1. Thus, the output of the sense amplifier is equal to the output of inverter 1 (406). Inverter 1 (406) will either output a low voltage level or a high voltage level. The exact range of values which indicate a high voltage level and a low voltage level depends on the design of the electronic device utilizing the crossbar memory array. For example, a low voltage signal may range from 0-0.2 volts. Additionally, a high voltage signal may range from 0.9-1.2 volts. In some cases, the output voltage may not be within the appropriate range of voltages used by the electronic circuitry utilizing the crossbar memory array. Consequently, a buffer driver circuit (401, FIG. 3) may be used to amplify the output voltage of the sense amplifier.

As will be appreciated by those skilled in the relevant art, before the output voltage (430) is read, the cross-coupled inverter circuit should be reset. By resetting the cross-coupled inverter circuit, the present state of the inverters will not be affected by a past state of the inverters. The cross-coupled inverter circuit can be reset through use of an equalization transistor (410) and a set transistor (412). The equalization transistor (410) is positioned between the gate terminals of the N-channel transistor of both inverters (406, 408). The equalization transistor (410) is controlled by an equalization clock (418). Additionally, the source terminals of the N-channel transistors of each inverter are connected to the drain terminal of a set transistor (412). The set transistor (412) is controlled by a set clock (420).

Figure 5:
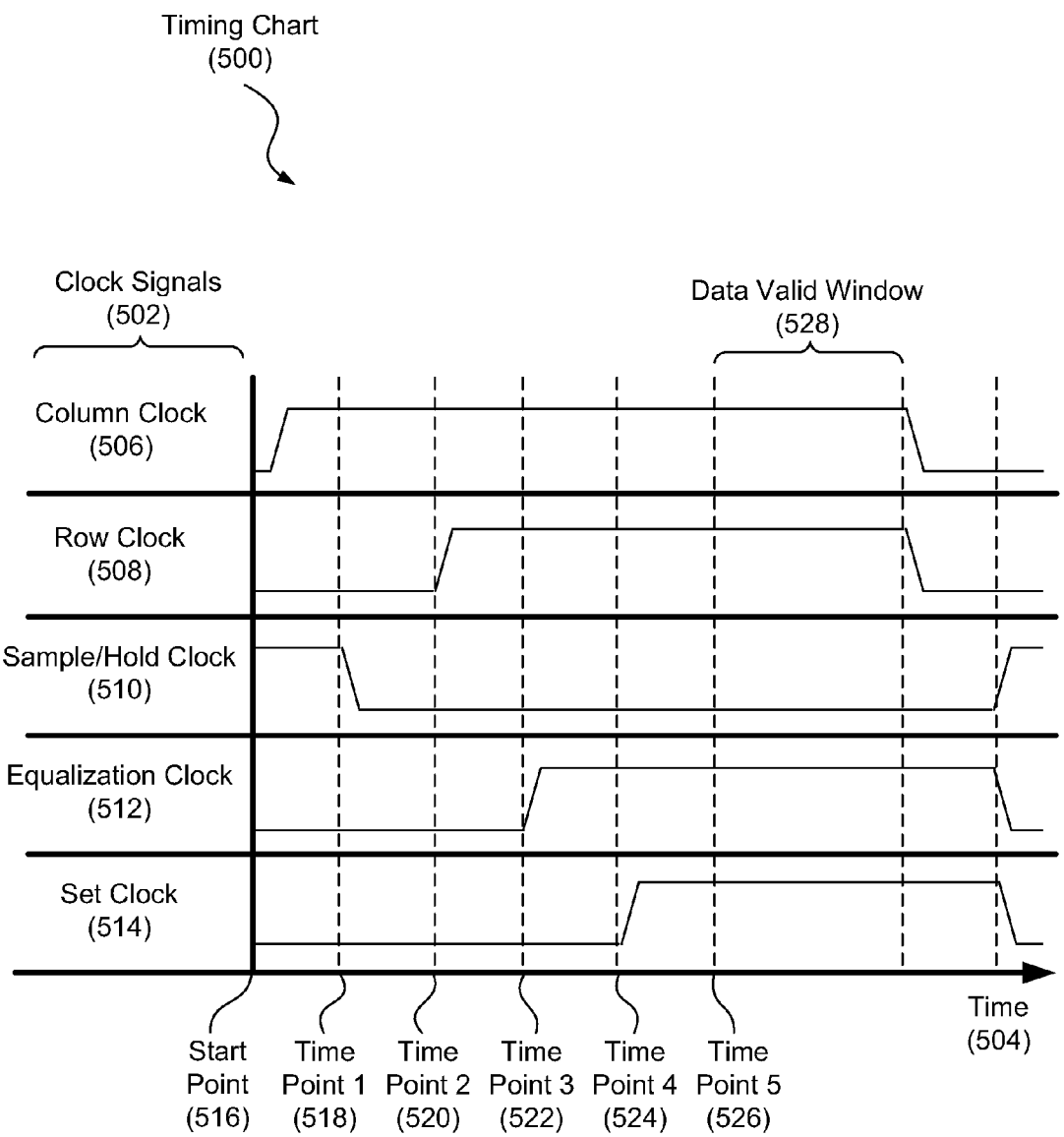
FIG. 5 is a diagram showing an illustrative timing chart for clock signals, according to one example of principles described herein.

FIG. 5 is a diagram showing an illustrative timing chart (500) for clock signals (502). The vertical axis of the chart (500) shows a number of clock signals (502) and the horizontal axis represents time (504). The clock signals illustrated include a column clock (506) and a row clock (508) which are used to select the column line (e.g. 302, FIG. 3) and row line (e.g. 310, FIG. 3) connected to a target memory element (e.g. 314, FIG. 3). The clock signals also include the sample and hold clock (510), the equalization clock (512), and a set clock (514). The sample and hold clock (510), equalization clock (512), and set clock correspond to the similarly named clocks illustrated in FIG. 4.

The timing chart shows the operation for a single read operation. At the start point (516) of the read operation, the row clock signal (508) is low. This indicates that the row line connected to the target memory element has not yet been selected. The sample and hold clock is high, allowing the storage transistor (e.g. 414, FIG. 4) to mirror the sense transistor (e.g. 402, FIG. 4). Additionally, the equalization clock (512) and the set clock (514) are both low. The operation starts by selecting the column line connected to the target memory element. This is done when the column clock (506) goes high.

At time point 1 (518), after the column line has been selected, the sample and hold clock (510) goes low. This causes the sample and hold switch (e.g. 416, FIG. 4) to open, causing the storage transistor to store the present voltage and stop mirroring the sense transistor. At time point 2 (520), after the sample and hold switch is open, the target memory element becomes fully selected when the row clock (508) goes high. When the row clock (508) goes high, the sense voltage is applied to the row line connected to the target memory element.

After the target memory element is fully selected, the cross-coupled inverter circuit is set. This is done with the equalization transistor and the set transistor. At time point 3 (522), the equalization clock goes high (512). At time point 4 (524), the set clock goes high. After the set clock goes high, the output of inverter 1 is now valid and indicative of the resistive state of the target memory element. There is then a time window (528) in which the output of the sense amplifier is valid. After this time window (528), the clock signals (502) can all go back to their starting positions to get ready for the next read operation.

Figure 6:
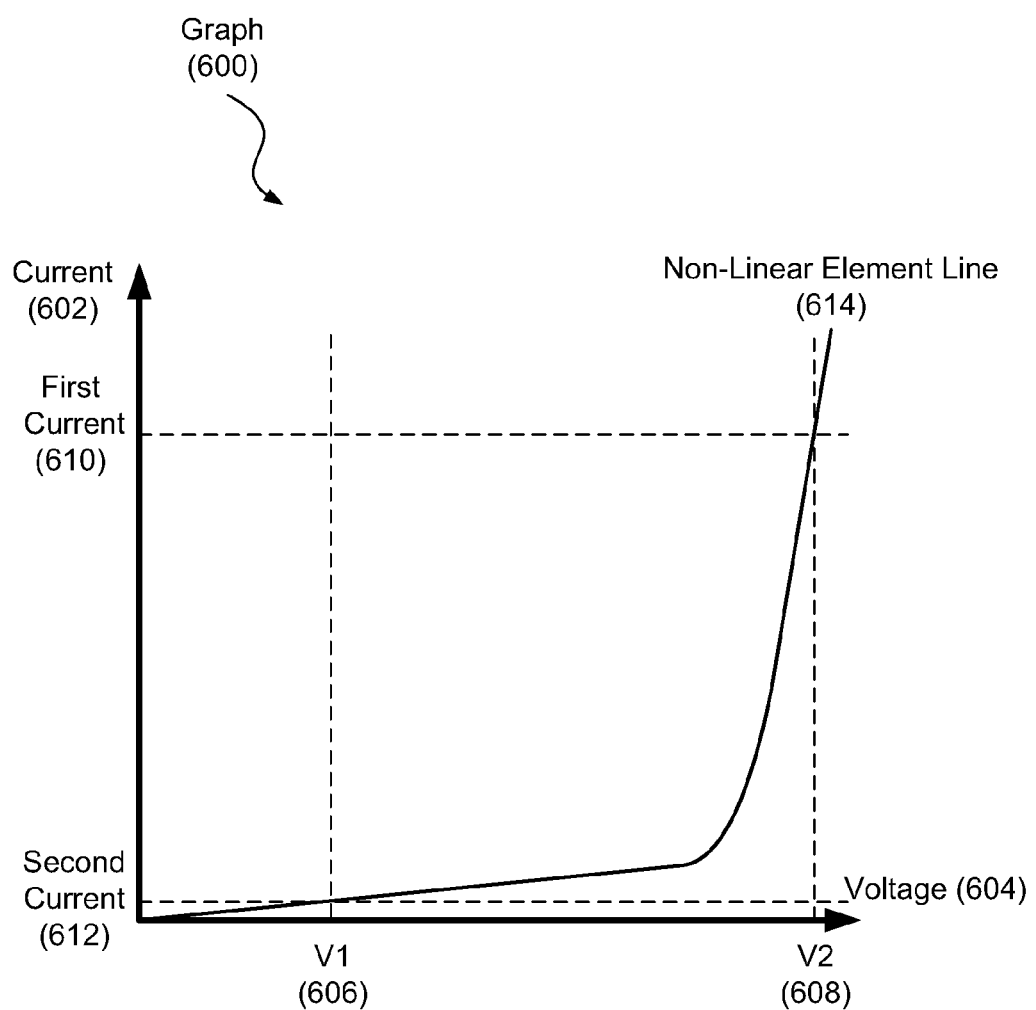
FIG. 6 is a diagram showing an illustrative voltage to current relation of a non-linear element, according to one example of principles described herein.

FIG. 6 is a graph (600) showing an illustrative voltage to current relation of a non-linear element. The horizontal axis of the graph (600) represents voltage (604) and the vertical axis of the graph (600) represents electric current (602). The non-linear element line (614) indicates the electric current (602) passing through a non-linear resistive element as a function of voltage (604).

According to certain illustrative examples, a voltage V2 (608) may be applied to a non-linear element. A first electric current (610) illustrated by the upper horizontal dotted line is the electric current value passing through the non-linear element with a voltage of V2 (608) applied. If a smaller voltage V1 (606) is applied, a second electric current (612) illustrated by the lower horizontal dotted line will flow through the non-linear element. If the second voltage is half the first voltage, then the second current (612) will be much smaller than half the first electric current (610) flowing through the non-linear element when V (608) is applied. This non-linear relationship allows bias voltages to be applied to unselected row lines within the crossbar array without overly affecting the electric current sensed from a selected target memory element.

For example, if a sense voltage of V2 (608) is applied to a selected line and the resulting output voltage of the current mirror is equal to V1 (606), the bias voltages may be set to V1 (606), the cumulative electric currents from several unselected row lines may still be less than the electric current flowing through the target memory element as a result of sense voltage V2 (608) being applied to the row line connected to the target memory element.

Figure 7:
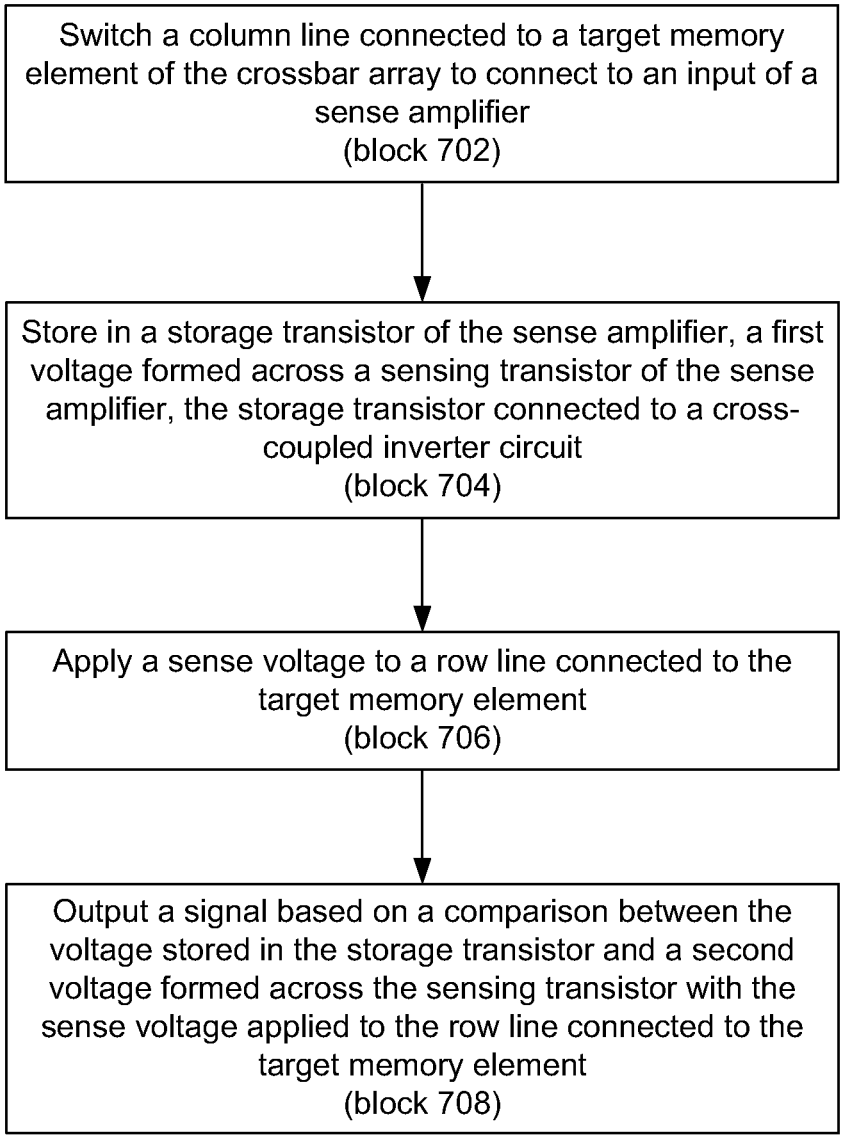
FIG. 7 is a flowchart showing an illustrative method for using a sense amplifier to read data stored in a crossbar array, according to one example of principles described herein.

FIG. 7 is a flowchart showing an illustrative method (700) for using a sense amplifier to read data stored in a crossbar array. According to certain illustrative examples, the method (700) includes switching (block 702) a column line connected to a target memory element of the crossbar array to connect to an input of a sense amplifier; storing (block 704) in a storage transistor of the sense amplifier, a first voltage formed across a sensing transistor of the sense amplifier, the storage transistor connected to a cross-coupled inverter circuit; applying (block 706) a sense voltage to a row line connected to the target memory element; and outputting (block 708) a signal based on a comparison between the voltage stored in the storage transistor and a second voltage formed across the sensing transistor with the sense voltage applied to the row line connected to the target memory element.

Through use of a system or method embodying principles described herein, the state of a target memory element within a crossbar array may be determined using a sense amplifier and without the need for isolation elements. Without isolation elements, a memory structure with a higher density may be realized. The higher memory density allows more data to be stored within a smaller physical amount of space. Additionally, the sense amplifier produces a digital output at the appropriate voltage levels for an electronic device utilizing the crossbar array.

The preceding description has been presented only to illustrate and describe examples and examples of the principles described. This description is not intended to be exhaustive or to limit these principles to any precise form disclosed. Many modifications and variations are possible in light of the above teaching.

What is claimed is:

1. A sense amplifier for reading the data stored in a crossbar array, the sense amplifier comprising:
   a storage transistor to store a first voltage resulting from an electric current from a column line connected to a target memory element while said target memory element is half-selected, said first voltage resulting from bias voltages applied to row lines not connected to said target memory element;
   a mirror transistor to store a second voltage resulting from an electric current from said column line while said target memory element is fully selected;
   a cross-coupled inverter circuit having a first branch connected to said storage transistor and a second branch connected to said mirror transistor; and
   an output node to output a signal from said first branch of said cross-coupled inverter circuit, said signal based on a comparison between said first voltage stored in said storage transistor and said second voltage across said mirror transistor.

2. The sense amplifier of claim 1, further comprising a sample and hold switch connected to a gate terminal of said storage transistor.

3. The sense amplifier of claim 2, in which said sample and hold switch is closed before said sense voltage is applied and is opened immediately before said sense voltage is applied.

4. The sense amplifier of claim 1, in which said cross-coupled inverter circuit comprises an equalization transistor controlled by an equalization clock signal and a set transistor controlled by a set clock signal.

5. The sense amplifier of claim 4, in which said cross-coupled inverter circuit is reset with said equalization transistor and said set transistor.

6. The sense amplifier of claim 1, further comprising a buffer driver circuit to amplify said signal to a logic level suitable for an electronic device utilizing said crossbar array.

7. A system for reading data stored in a crossbar array, the system comprising the sense amplifier of claim 1 and circuitry to:
   operate a switch to switch a column line connected to a target memory element of said crossbar array to connect to an input of said sense amplifier, said switch being configured to connect said column line to said input of said sense amplifier when said target memory element is half-selected, such that said first voltage resulting from bias voltages applied to row lines not connected to said target memory element is delivered to said storage transistor;
   after storing said first voltage in said storage transistor, apply a sense voltage to a row line connected to said target memory element; and
   with said sense amplifier, output a signal based on a comparison between said voltage stored in said storage transistor and a second voltage formed across a sensing transistor with said sense voltage applied to said row line connected to said target memory element.

8. The system of claim 7, in which a gate terminal of said storage transistor is connected to a sample and hold switch, said sample and hold switch being closed before said sense voltage is applied and being opened immediately before said sense voltage is applied.

9. The system of claim 7, in which said cross-coupled inverter circuit comprises an equalization transistor controlled by an equalization clock signal and a set transistor controlled by a set clock signal.

10. The system of claim 9, in which said circuitry resets said cross-coupled inverter circuit with said equalization transistor and said set transistor.

11. The system of claim 7, in which said circuitry includes a buffer driver circuit to amplify said signal to a logic level suitable for an electronic device utilizing said crossbar array.

12. A method for using a sense amplifier to read data from a crossbar memory array, the method comprising:
   switching a column line connected to a target memory element of said crossbar array to connect to an input of a sense amplifier;
   storing in a storage transistor of said sense amplifier, a first voltage formed across a sensing transistor of said sense amplifier, said first voltage resulting from bias voltages applied to row lines not connected to said target memory element, said storage transistor connected to a cross-coupled inverter circuit;
   applying a sense voltage to a row line connected to said target memory element; and
   with said sense amplifier, outputting a signal based on a comparison between said voltage stored in said storage transistor and a second voltage formed across said sensing transistor with said sense voltage applied to said row line connected to said target memory element.

13. The method of claim 12, in which a gate terminal of said storage transistor is connected to a sample and hold switch.

14. The method of claim 13, in which said sample and hold switch is closed before said sense voltage is applied and is opened immediately before said sense voltage is applied.

15. The method of claim 12, in which said cross-coupled inverter circuit comprises an equalization transistor controlled by an equalization clock signal and a set transistor controlled by a set clock signal.

16. The method of claim 15, further comprising, resetting said cross-coupled inverter circuit with said equalization transistor and said set transistor.

17. The method of claim 12, further comprising, with a buffer driver circuit, amplifying said signal to a logic level suitable for an electronic device utilizing said crossbar array.

18. The method of claim 12, in which said crossbar array is a disjointed crossbar array.

19. The method of claim 12, in which memory elements within said crossbar array comprise non-linear resistive elements.

20. The method of claim 19, in which said non-linear resistive memory elements within said crossbar array comprise memristive elements.

* * * * *